(12) United States Patent
Osaka

(10) Patent No.: US 8,008,945 B2
(45) Date of Patent: Aug. 30, 2011

(54) LEVEL-SHIFT CIRCUIT

(75) Inventor: Shohei Osaka, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 12/612,306

(22) Filed: Nov. 4, 2009

(65) Prior Publication Data

US 2010/0123479 A1 May 20, 2010

(30) Foreign Application Priority Data

Nov. 17, 2008 (JP) ................... 2008-293413

(51) Int. Cl.
*H03K 19/0175* (2006.01)
(52) U.S. Cl. ....................................... 326/80
(58) Field of Classification Search ............. 326/62, 326/63, 68, 80–81; 327/333
See application file for complete search history.

(56) References Cited

U.S. PATENT DOCUMENTS
5,543,740 A * 8/1996 Wong .............................. 327/108

FOREIGN PATENT DOCUMENTS
JP 2005-512444 4/2005

OTHER PUBLICATIONS
U.S. Appl. No. 12/607,646, filed Oct. 28, 2009, Osaka.

* cited by examiner

*Primary Examiner* — Shawki S Ismail
*Assistant Examiner* — Thienvu V Tran
(74) *Attorney, Agent, or Firm* — Oblon, Spivak, McClelland, Maier & Neustadt, L.L.P.

(57) ABSTRACT

A level-shift circuit converts a first voltage level into a second voltage level different from the first voltage level. The level-shift circuit includes a first high-side signal detection circuit, a second high-side signal detection circuit, a drive circuit and electric current detection circuits. The first high-side signal detection circuit sets a logical voltage state of the second voltage level via a first capacitor. The second high-side signal detection circuit resets the logical voltage state of the second voltage level via a second capacitor. The drive circuit on-off drives a high-side switch connected to a low-side switch in series by a set signal of the first high-side signal detection circuit and a reset signal of the second high-side signal detection circuit. The electric current detection circuits detect an electric current flowing into or from the first and/or second capacitors.

2 Claims, 5 Drawing Sheets

LEVEL-SHIFT CIRCUIT

CROSS REFERENCE TO RELATED APPLICATION

This application claims benefit of priority under 35 U.S.C. §119 to Japanese Patent Application No. 2008-293413, filed on Nov. 17, 2008, the entire contents of which are incorporated by reference herein.

BACKGROUND OF THE INVENTION

1. Field of the Invention

The present invention relates to a level-shift circuit that carries out a level-shift needed for a switch in a half-bridge configuration.

2. Description of the Related Art

As a conventional level-shift circuit, for example, there has been known a level-shift circuit disclosed in a patent document 1 (Published Japanese Translation of PCT International Application No. 2005-512444).

In this level-shift circuit, for a high-side ground potential at a middle point between a high-side switch and a low-side switch in a half-bridge configuration, a voltage level greatly varies within a certain range (e.g., a range of 0 V to 400 V with respect to the ground potential), in synchronization with on/off action of the high-side switch and the low-side switch. Thus, a high-side driver for applying a potential higher than the high-side ground potential is employed to a gate of the high-side switch.

Also, in this level-shift circuit, there are provided a first capacitor and a second capacitor as two passive devices. A rising edge of pulse signal is input into the first capacitor via a first driver, and a rising edge of pulse signal inverted into a falling edge of pulse signal by an inverter is input into the second capacitor. The first capacitor serves to render an electric current to flow by the rising edge of pulse signal. The second capacitor servers to render an electric current to flow by the falling edge of pulse signal.

Namely, each of the first capacitor and the second capacitor temporarily generates an electric current, and sets or resets a latch at a proper time required to properly drive a half-bridge driver or a circuit similar to the half-bridge driver using the temporal electric current. The high-side driver turns on or off the high-side switch using a set signal or a reset signal from the latch.

In the above-described configuration, when a charging voltage of each of the first capacitor and the second capacitor varies according to not a set signal or a reset signal, but instead an external factor, an electric current temporarily flows into or from each of the first capacitor and the second capacitor.

In the above-described configuration, there is a possibility that an inductance load such as a transformer or a reactor is connected to the middle point between the high-side switch and the low-side switch in the half-bridge configuration. Here, it is noted that an inductance component of the inductance load oscillates by voltage fluctuation or current fluctuation due to the switching action of the high-side switch and the low-side switch.

A whole high-side potential of the high-side driver oscillates by this oscillation because a potential at the middle point between the high-side switch and the low-side switch is the high-side ground potential. If the charging voltage of each of the first capacitor and the second capacitor varies according to the external factor, each of the first capacitor and the second capacitor temporarily generates an electric current independent of a set signal or a reset signal. This brings the latch circuit to malfunction, which causes unreliable signal transmission to the high-side switch.

SUMMARY OF THE INVENTION

It is an object of the present invention to provide a level-shift circuit that prevents malfunction due to oscillation of a high-side potential of a high-side driver to carry out reliable signal transmission.

In order to achieve the above-described object, according to one aspect of the present invention, there is provides a level-shift circuit that converts a first voltage level into a second voltage level different from the first voltage level, comprising: a set level circuit that sets a logical voltage state of the second voltage level via a first capacitor; a reset level circuit that resets the logical voltage state of the second voltage level via a second capacitor; a drive circuit that on-off drives a high-side switch connected to a low-side switch in series by a set signal of the set level circuit and a reset signal of the reset level circuit; and an electric current detection circuit that detects at least one of an electric current flowing into or from the first capacitor and an electric current flowing into or from the second capacitor.

In a preferred embodiment of the present invention, the level-shift circuit further comprising a mask circuit that masks at least one of a drive signal input into the set level circuit and a drive signal input into the reset level circuit during a period of time when the electric current detection circuit carries out the detection and an electric current flows into or from the first capacitor and the second capacitor.

In a preferred embodiment of the present invention, for a logical voltage state of a different voltage level driven by the set level circuit and the reset level circuit, the reset signal of the reset level circuit is accorded priority over the set signal of the set level circuit.

According to the present invention, the electric current detection circuit can detect voltage fluctuation of a high-side ground potential VS at a connection point of the high-side switch and the low-side switch by detecting an electric current flowing into or from the first capacitor and/or the second capacitor (that is, detecting a charging or discharging period). Therefore, in a case where the high-side ground potential VS is a middle point potential of a half-bridge circuit or a full-bridge circuit, fluctuation of the middle point potential can be detected by charging or discharging of capacitor(s).

Namely, by detecting the middle point potential, the high-side switch and the low-side switch can be driven at a proper time, and a short circuit current due to a recovery current of each switching element occurring at a time when a drive signal is output during fluctuation of the middle point potential can be prevented from flowing in the half-bridge circuit or the full-bridge circuit. Therefore, the present invention can prevent unreliable signal transmission which occurs by undesired capacitor charging or discharging due to external factor such as voltage fluctuation of the different potential level, which realizes that reliable signal transmission is carried out.

Further, when an electric current is detected by the electric current detection circuit, the mask circuit masks a drive signal to be input into the set level circuit and the reset level circuit during the period when the electric current flows into or from the first capacitor and/or the second capacitor. This also can prevent unreliable signal transmission which occurs by undesired capacitor charging or discharging due to external factor such as voltage fluctuation of the different potential level, which realizes that reliable signal transmission is carried out.

DESCRIPTION OF THE EMBODIMENTS

Level-shift circuits according to embodiments of the present invention will be described below, with reference to FIGS. 1 to 6.

The present invention is directed to transmit a signal to a different voltage level via a capacitor, so as to reduce power consumption which occurs at a time of signal transmission and prevent unreliable signal transmission which occurs by undesired capacitor charging or discharging due to voltage fluctuation of the different voltage level using an electric current detection circuit and a mask circuit, which realizes that reliable signal transmission is carried out.

First Exemplary Embodiment

Figure 1:
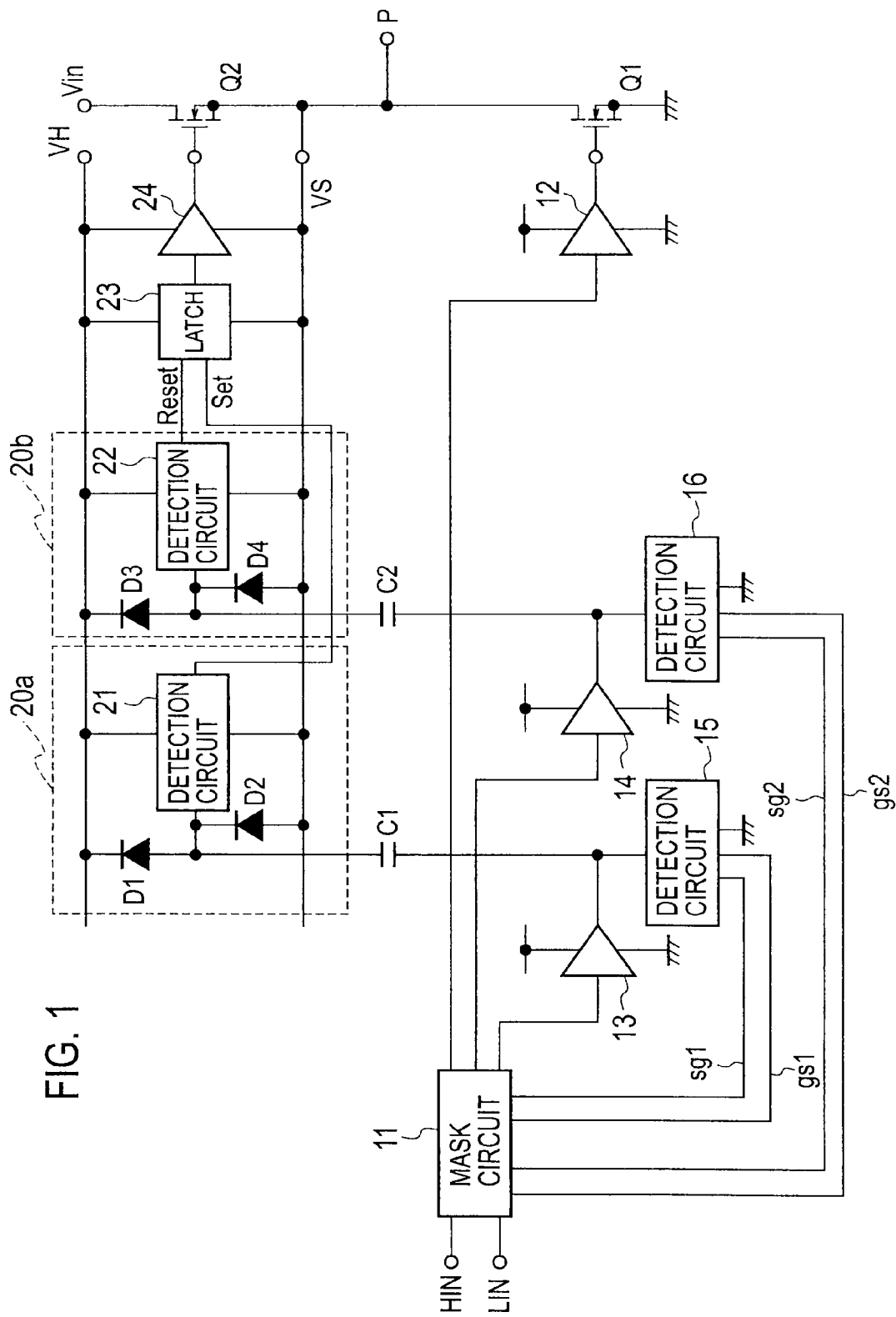
FIG. 1 is a block diagram illustrating a level-shift circuit according to a first exemplary embodiment of the present invention.

FIG. 1 is a block diagram illustrating a level-shift circuit according to a first exemplary embodiment of the present invention. In the level-shift circuit, a series circuit is connected between a power source Vin and the ground. In the series circuit, a low-side switch Q1 composed of MOSFET is connected to a high-side switch Q2 composed of MOSFET in series. The low-side switch Q1 and the high-side switch Q2 make up a half-bridge circuit.

It is noted that instead of the half-bridge circuit, a full-bridge circuit may be employed.

A mask circuit 11 outputs to a drive circuit 12 a low-side instruction signal input into a LIN terminal thereof. The drive circuit 12 drives the low-side switch Q1 based on the low-side instruction signal from the mask circuit 11.

The mask circuit 11 outputs to buffers 13 and 14 a high-side instruction signal input into a HIN terminal thereof. A first capacitor C1 is connected to an output of the buffer 13. The buffer 13 sends a set signal to a first high-side signal detection circuit 20a via the first capacitor C1. A second capacitor C2 is connected to an output of the buffer 14. The buffer 14 sends a reset signal to a second high-side signal detection circuit 20b via the second capacitor C2.

A detection circuit 15 is connected to one end of the first capacitor C1 and the output of the buffer 13. A detection circuit 16 is connected to one end of the second capacitor C2 and the output of the buffer 14.

The detection circuit 15 corresponds to the electric current detection circuit of the present invention, detects a charging current flowing into the first capacitor C1 or a discharging current flowing from the first capacitor C1, and outputs to the mask circuit 11 a charging period detection signal gs1 or a discharging period detection signal sg1. The detection circuit 16 corresponds to the electric current detection circuit of the present invention, detects a charging current flowing into the second capacitor C2 or a discharging current flowing from the second capacitor C2, and outputs to the mask circuit 11 a charging period detection signal gs2 or a discharging period detection signal sg2.

The other end of the first capacitor C1 is connected to the first high-side signal detection circuit 20a. The other end of the second capacitor C2 is connected to the second high-side signal detection circuit 20b.

The first high-side signal detection circuit 20a corresponds to a set circuit of the present invention and includes a diode D1, a diode D2 and a detection circuit 21. The diode D1 has an anode connected to the other end of the first capacitor C1 and a cathode connected to a high potential VH higher than a high-side ground potential VS. The diode D2 has a cathode connected to the other end of the first capacitor C1 and an anode connected to the high-side ground potential VS. The detection circuit 21 detects a signal generated on the other end of the first capacitor C1. The first high-side signal detection circuit 20a detects a set signal and outputs the detected set signal to a latch 23.

The second high-side signal detection circuit 20b corresponds to a reset circuit of the present invention and includes a diode D3, a diode D4 and a detection circuit 22. The diode D3 has an anode connected to the other end of the second capacitor C2 and a cathode connected to the high potential VH higher than the high-side ground potential VS. The diode D4 has a cathode connected to the other end of the second capacitor C2 and an anode connected to the high-side ground potential VS. The detection circuit 22 detects a signal generated on the other end of the second capacitor C2. The second high-side signal detection circuit 20b detects a reset signal and outputs the detected reset signal to the latch 23.

The latch 23 is set by the set signal from the detection circuit 21 and reset by the reset signal from the detection circuit 22. A drive circuit 24 corresponds to a drive circuit of the present invention and drives the high-side switch Q2 based on an output from the latch 23.

A high-side circuit is made up by the first high-side signal detection circuit 20a, the second high-side signal detection circuit 20b, the latch 23 and the drive circuit 24, and regards a potential at a middle point P of the half-bridge circuit as the high-side ground potential VS.

For the high-side ground potential VS, a voltage level greatly varies in synchronization with on/off action of the high-side switch Q2 and the low-side switch Q1. When the high-side ground potential VS varies, potentials of the first and second capacitors C1 and C2 vary depending on variation of the high-side ground potential VS. At this time, a charging current flows into each of the first capacitor C1 and the second capacitor C2, or a discharging current flows from each of the first capacitor C1 and the second capacitor C2.

Figure 2:
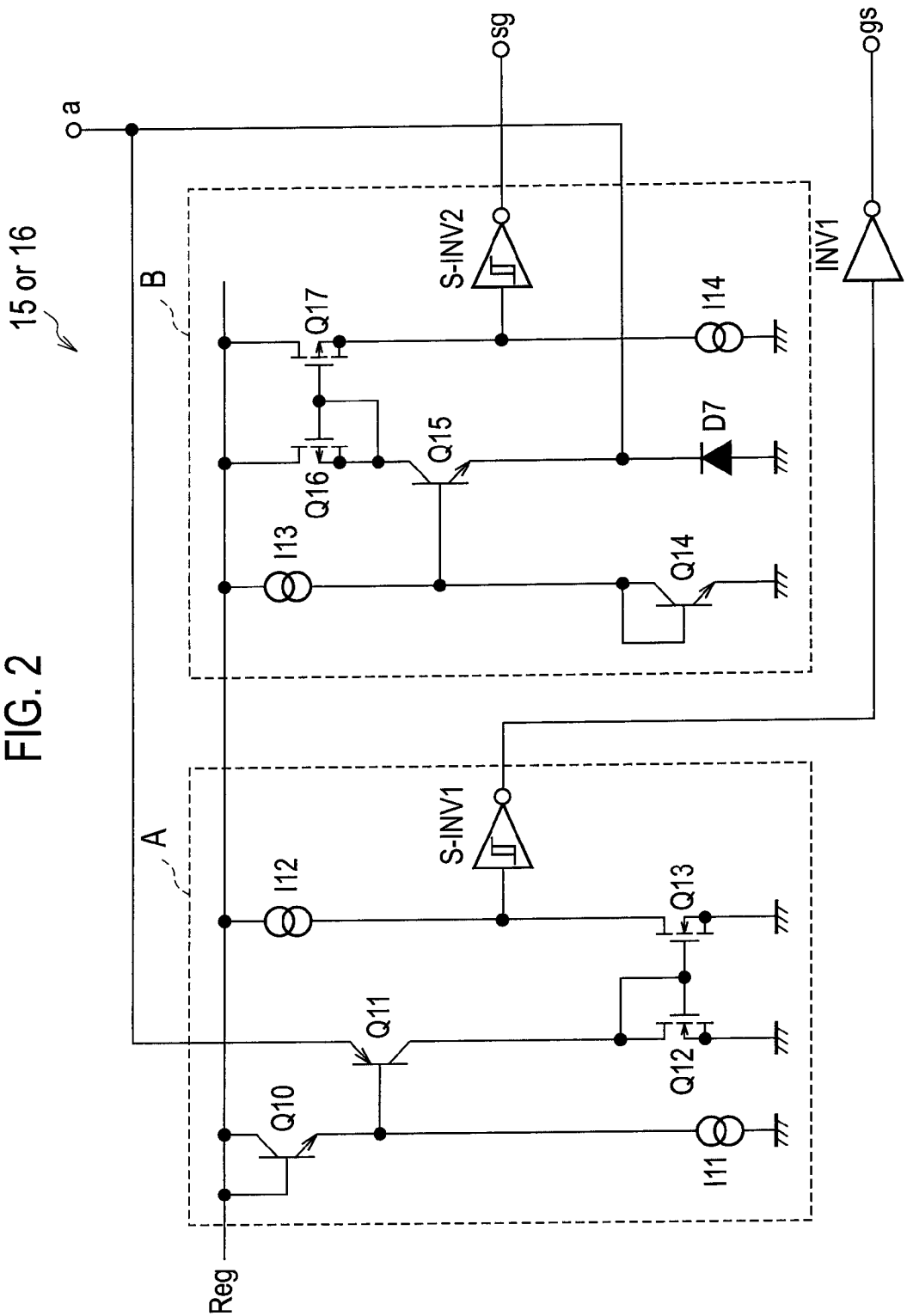
FIG. 2 is a block diagram illustrating one example of each detection circuit in the level-shift circuit shown in FIG. 1.

FIG. 2 is a block diagram illustrating one example of each of the detection circuits 15 and 16 in the level-shift circuit according to the first exemplary embodiment shown in FIG. 1.

In a block "A" shown in FIG. 2, a positive clamp circuit is made up by an NPN transistor Q10, a PNP transistor Q11 and a current source I11. A base and a collector of the transistor Q10 are connected to a power source Reg, and an emitter of the transistor Q10 is connected to one end of the current source I11 and a base of the transistor Q11. The other end of the current source I11 is grounded. An emitter of the transistor Q11 is connected to an "a" terminal which is connected to the first capacitor C1 (or the second capacitor C2).

A collector of the transistor Q11 is connected to a drain and a gate of an N-MOSFET Q12 and a gate of an N-MOSFET Q13. A source of the MOSFET Q12 and a source of the MOSFET Q13 are grounded. A drain of the MOSFET Q13 is connected to an input end of a Schmitt inverter S-INV1 and the power source Reg via a current source I12.

The Schmitt inverter S-INV1 outputs the charging period detection signal gs1 (or gs2) from an output end thereof to the mask circuit 11 via an inverter INV1. A first current mirror circuit is made up by the MOSFET Q12 and the MOSFET Q13.

In a block "B" shown in FIG. 2, a negative clamp circuit is made up by an NPN transistor Q14, a NPN transistor Q15 and a current source I13. A series circuit is connected between the power source Reg and the ground. In the series circuit, the current source I13 is connected to the transistor Q14 in series. A base and a collector of the transistor Q14 are commonly connected to each other. A base of the transistor Q15 is connected to a connection point of the current source I13 and the transistor Q14.

A collector of the transistor Q15 is connected to a drain and a gate of a P-MOSFET Q16 and a gate of a P-MOSFET Q17. A source of the MOSFET Q16 and a source of the MOSFET Q17 are connected to the power source Reg. An emitter of the transistor Q15 is connected to a cathode of a diode D7 and the "a" terminal. An anode of the diode D7 is grounded.

A drain of the MOSFET Q17 is connected to an input end of a Schmitt inverter S-INV2 and grounded via a current source I14. The Schmitt inverter S-INV2 outputs the discharging period detection signal sg1 (or sg2) from an output end thereof to the mask circuit 11. A second current mirror circuit is made up by the MOSFET Q16 and the MOSFET Q17.

Figure 3:
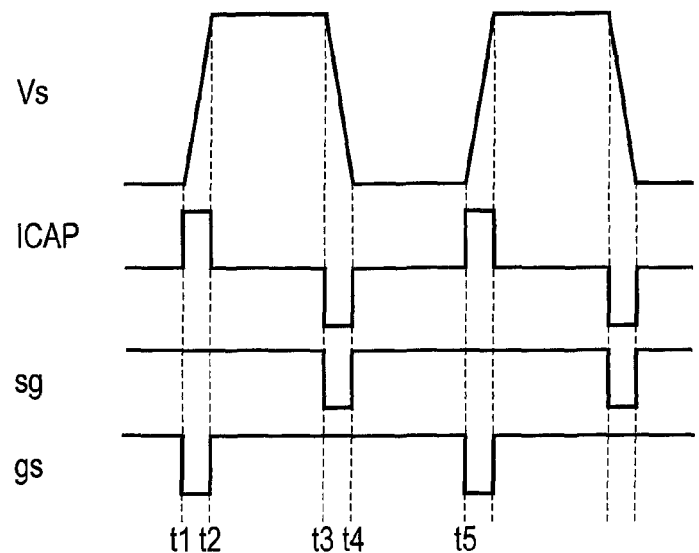
FIG. 3 is a waveform diagram illustrating action of each detection circuit shown in FIG. 2.

Next, action of each of the detection circuits 15 and 16 shown in FIG. 2 will be described with reference to FIG. 3. FIG. 3 is a waveform diagram illustrating action of the detection circuit shown in FIG. 2. In FIG. 3, a symbol "VS" represents the high-side ground potential (high-side ground terminal voltage), a symbol "ICAP" represents an electric current flowing into or from each of the first capacitor C1 and the second capacitor C2, a symbol "sg" represents an output signal of the Schmitt inverter S-INV2, and a symbol "gs" represents an output signal of the inverter INV1.

Firstly, from a time t1 to a time t2, when the high-side ground potential VS increases from 0V, a potential of each of the first capacitor C1 and the second capacitor C2 varies, which causes a charging current ICAP to flow into each of the first capacitor C1 and the second capacitor C2. Then, if a voltage of the "a" terminal connected to the first capacitor C1 (or the second capacitor C2) increases to or more than a voltage of the power source Reg, this turns on the transistor Q11, which clamps a potential of the "a" terminal to the voltage of the power source Reg using the positive clamp circuit to prevent the potential of the "a" terminal from increasing to or more than the voltage of the power source Reg.

When the positive clamp circuit operates to turn on the MOSFET Q12, the charging current ICAP of the first capacitor C1 (or the second capacitor C2) is input into the first current mirror circuit via the transistor Q11.

If an output current of the first current mirror circuit (an electric current flowing from the MOSFET Q13) is equal to or more than an electric current of the current source I12, an output end voltage of the first current mirror turns to an "L" level. On the other hand, if the output current of the first current mirror circuit (the electric current flowing from the MOSFET Q13) is less than the current of the current source I12, the output end voltage of the first current mirror turns to an "H" level.

A voltage level of the output end voltage of the first current mirror circuit is inverted by the Schmitt inverter S-INV1, again inverted by the inverter INV1, and output to the mask circuit 11 as the charging period detection signal gs.

Namely, a charging period of the first capacitor C1 (or the second capacitor C2) can be detected because a logical level of the Schmitt inverter S-INV1 changes for a period of time when the positive clamp circuit operates.

Next, from a time t3 to a time t4, when the high-side ground potential VS decreases from an increased voltage to 0 V, a potential of each of the first capacitor C1 and the second capacitor C2 varies, which causes a discharging current ICAP to flow from each of the first capacitor C1 and the second capacitor C2. Then, if a voltage of the "a" terminal connected to the first capacitor C1 (or the second capacitor C2) decreases less than the ground voltage, this turns on the transistor Q15, which clamps a potential of the "a" terminal to the ground voltage using the negative clamp circuit to prevent the potential of the "a" terminal from decreasing less than the ground voltage.

When the negative clamp circuit operates to turn on the MOSFET Q16, the discharging current ICAP of the first capacitor C1 (or the second capacitor C2) is input into the second current mirror circuit via the transistor Q15.

If an output current of the second current mirror circuit (an electric current flowing from the MOSFET Q17) is equal to or more than an electric current of the current source I14, an output end voltage of the second current mirror turns to an "H" level. On the other hand, if the output current of the second current mirror circuit (the electric current flowing from the MOSFET Q17) is less than the electric current of the current source I14, the output end voltage of the second current mirror turns to an "L" level.

A voltage level of the output end voltage of the second current mirror circuit is input into the Schmitt inverter S-INV2 and then output to the mask circuit 11 as the discharging period detection signal sg.

Namely, a discharging period of the first capacitor C1 (or the second capacitor C2) can be detected because a logical level of the Schmitt inverter S-INV2 changes for a period of time when the negative clamp circuit operates.

Thus, when an electric current flows into or from each of the first capacitor C1 and the second capacitor C2, the positive clamp circuit or the negative clamp circuit operates depending on a direction of the electric current, which allows each of the detection circuit 15 and the detection circuit 16 to output the charging period detection signal gs or the discharging period detection signal sg.

Figure 4:
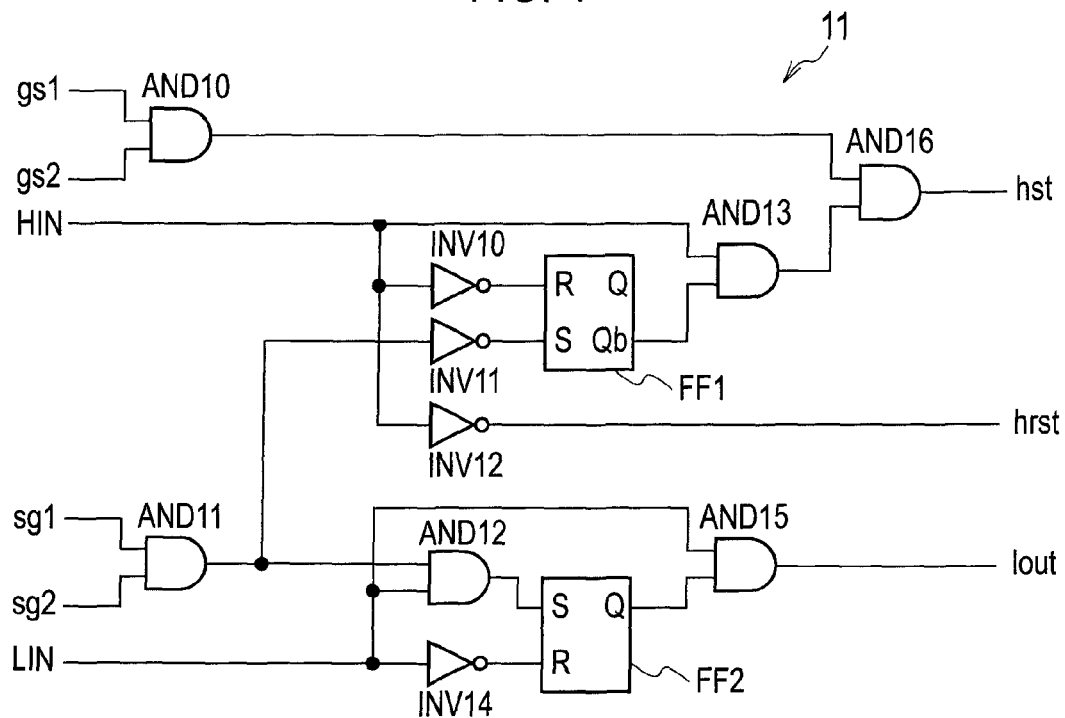
FIG. 4 is a block diagram illustrating one example of a mask circuit in the level shift circuit shown in FIG. 1.

FIG. 4 is a block diagram illustrating one example of a mask circuit in the level shift circuit shown in FIG. 1.

In FIG. 4, an AND circuit AND10 carries out AND operation with respect to the charging period detection signal gs1 from the detection circuit 15 and the charging period detection signal gs2 from the detection circuit 16, and then outputs the result to an AND circuit AND16. An AND circuit AND11 carries out AND operation with respect to the discharging period detection signal sg1 from the detection circuit 15 and the discharging period detection signal sg2 from the detection circuit 16, and then outputs the result to an AND circuit AND12 and an inverter INV11.

An inverter INV10 inverts a high-side instruction signal HIN and outputs the result to a reset terminal R of a flip-flop circuit FF1. An inverter INV11 inverts the output of the AND circuit AND11 and outputs the result to a set terminal S of the flip-flop circuit FF1. An inverter INV12 inverts the high-side instruction signal HIN and outputs the result as a high-side reset signal hrst.

The flip-flop circuit FF1 outputs to an AND circuit AND13 an output of a Qb terminal generated by inverting an output of a Q terminal. The AND circuit AND13 carries out AND operation with respect to the high-side instruction signal HIN and the inverted output Qb of the flip-flop circuit FF1, and outputs the result to an AND circuit AND16. The AND circuit AND16 carries out AND operation with respect to an output of the AND circuit AND10 and an output of the AND circuit AND13, and outputs the result as a high-side set signal hst.

The AND circuit AND12 carries out AND operation with respect to an output of the AND circuit AND11 and a low-side instruction signal LIN, and outputs the result to a set terminal S of a flip-flop circuit FF2. An inverter INV14 inverts the low-side instruction signal LIN and outputs the result to a reset terminal R of the flip-flop circuit FF2.

The flip-flop circuit FF2 outputs to an AND circuit AND15 an output of a Q terminal. The AND circuit AND15 carries out AND operation with respect to the low-side instruction signal LIN and the output Q of the flip-flop circuit FF2, and outputs the result as a low-side drive signal lout.

Figure 5:
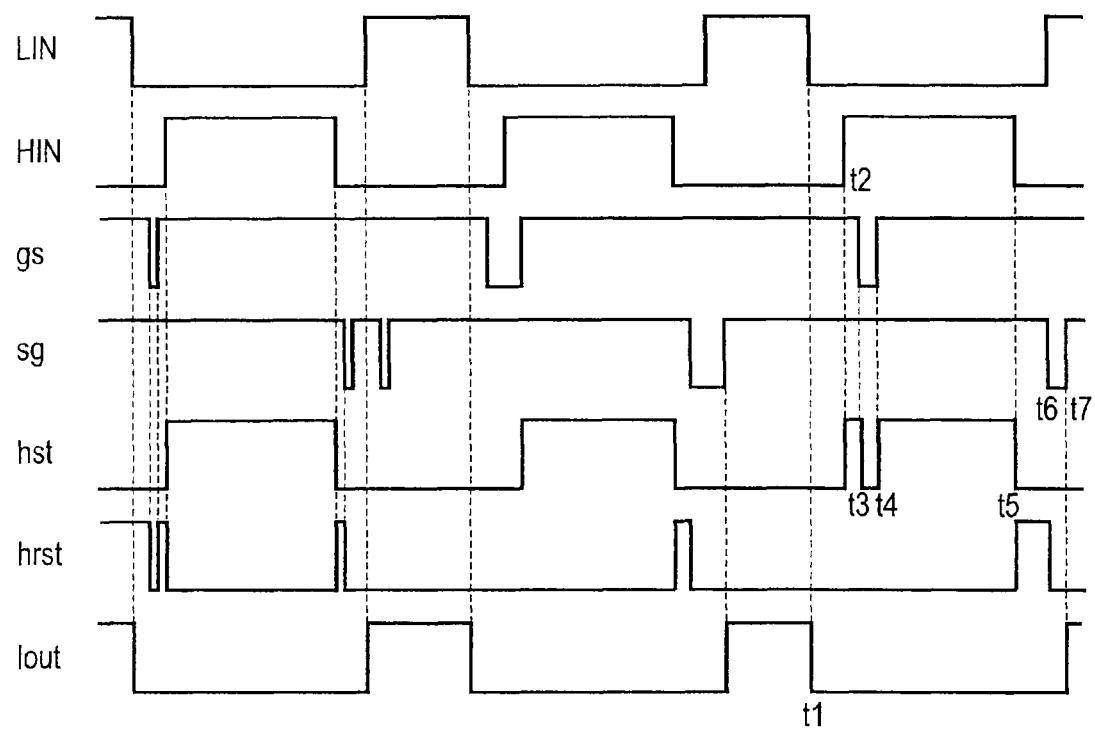
FIG. 5 is a waveform diagram illustrating action of the mask circuit shown in FIG. 4.

Next, action of the mask circuit 11 will be described with reference to FIG. 5. FIG. 5 is a waveform diagram illustrating action of the mask circuit shown in FIG. 4. In FIG. 5, a symbol "LIN" represents the low-side instruction signal, a symbol "HIN" represents the high-side instruction signal, a symbol "gs" represents the charging period detection signal, a symbol "sg" represents the discharging period detection signal, a symbol "hst" represents the high-side set signal, a symbol "hrst" represents the high-side reset signal, and a symbol "lout" represents the low-side drive signal.

Firstly, at a time t1, when the low-side instruction signal LIN turns to L level, the output of the AND circuit AND15 becomes L level. This causes the low-side drive signal lout to become L level.

Next, at a time t2, when the high-side instruction signal HIN turns to H level, the output of the AND circuit AND16 becomes H level. This outputs the high-side set signal hst at H level.

Then, from a time t3 to a time t4 (charging period of the first capacitor C1 and/or the second capacitor C2), the charging period detection signal gs keeps L level due to the charging of the first capacitor C1 and/or the second capacitor C2, which causes the output of the AND circuit AND10 to become L level. This outputs the high-side set signal hst at L level. Thereby, the high-side instruction signal HIN can be masked during the charging period of the first capacitor C1 and the second capacitor C2.

At a time t4, when the charging period detection signal gs turns to H level, the high-side set signal hst is output at H level because the high-side instruction signal HIN keeps H level.

At a time t5, when the high-side instruction signal HIN turns to L level, the high-side reset signal hrst is output at H level by the inverter INV12.

From a time t6 to a time t7 (discharging period of the first capacitor C1 and/or the second capacitor C2), the discharging period detection signal sg keeps L level due to the discharging of the first capacitor C1 and/or the second capacitor C2, which causes the output of the AND circuit AND15 to become L level. This outputs the low-side drive signal lout at L level.

At a time t7, when the discharging period detection signal sg turns to H level, the low-side drive signal lout is output at H level because the output of the AND circuit AND15 becomes H level due to a discharging period finish signal (the discharging period detection signal sg with H level) of the first capacitor C1 and/or the second capacitor C2 and the low-side instruction signal LIN with H level.

According to the mask circuit 11 shown in FIG. 4, the high-side set signal hst masks the high-side instruction signal HIN due to the charging period detection signal gs with L level during the charging period of the first capacitor C1 and/or the second capacitor C2. In a case where the discharging period detection signal sg with L level is not detected, the high-side set signal hst is output.

The low-side drive signal lout compares a rising of the low-side instruction signal LIN to the discharging period detection signal sg. If the discharging period detection signal sg is detected before a detection of the low-side instruction signal LIN, the low-side drive signal lout is masked and then output after the discharging period is finished.

However, after the low-side drive signal lout has been output by the low-side instruction signal LIN, even if the discharging period is detected, the output of the low-side drive signal lout is maintained.

Thus, according to the level-shift circuit of the first exemplary embodiment, the detection circuits 15 and 16 can detect voltage fluctuation of the high-side ground potential VS at the connection point of the high-side switch Q2 and the low-side switch Q1 by detecting an electric current flowing into or from the first capacitor C1 and/or the second capacitor C2 (that is, detecting the charging or discharging period). Therefore, in a case where the high-side ground potential VS is a middle point potential of a half-bridge circuit or a full-bridge circuit, fluctuation of the middle point potential can be detected by charging or discharging of capacitor(s).

Namely, by detecting the middle point potential, the high-side switch Q2 and the low-side switch Q1 can be driven at a proper time, and a short circuit current due to a recovery current of each switching element occurring at a time when a drive signal is output during fluctuation of the middle point potential can be prevented from flowing in the half-bridge circuit or the full-bridge circuit. Therefore, this level-shift circuit can prevent unreliable signal transmission which occurs by undesired capacitor charging or discharging due to external factor such as voltage fluctuation of the different potential level, which realizes that reliable signal transmission is carried out.

Further, when an electric current is detected by the detection circuit 15 and/or the detection circuit 16, the mask circuit 11 masks a drive signal to be input into the first high-side signal detection circuit 20a and the second high-side signal detection circuit 20b during the period when the electric current flows into or from the first capacitor C1 and/or the second capacitor C2. This also can prevent unreliable signal transmission which occurs by undesired capacitor charging or discharging due to external factor such as voltage fluctuation of the different potential level, which realizes that reliable signal transmission is carried out.

Second Exemplary Embodiment

Figure 6:
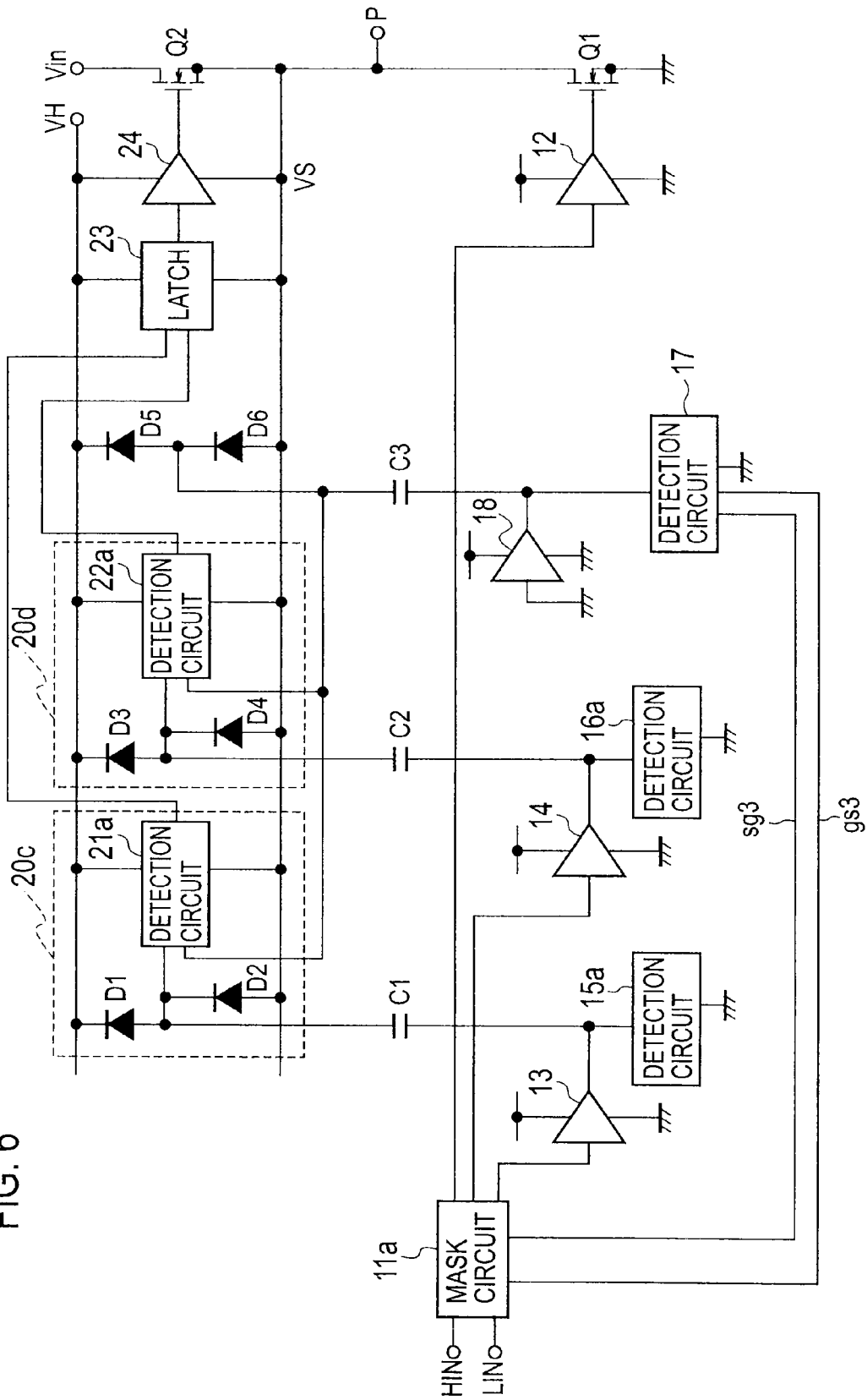
FIG. 6 is a block diagram illustrating a level-shift circuit according to a second exemplary embodiment of the present invention.

FIG. 6 is a block diagram illustrating a level-shift circuit according to a second exemplary embodiment of the present invention. The level-shift circuit shown in FIG. 6 differs from the level-shift circuit shown in FIG. 1 in that a detection circuit 17, a third capacitor C3, diodes D5 and D6 and a buffer 18 are added and a signal detection method of detection circuits 21a and 22a in the detection circuits 15a and 16a is changed in a differential manner.

A series circuit composed of the diodes D5 and D6 is connected between the high potential VH and the high-side ground potential VS. A connection point of the diodes D5 and D6 is connected to the detection circuit 21a of a first high-side signal detection circuit 20c and the detection circuit 22a of a second high-side signal detection circuit 20d and connected to the detection circuit 17 and the buffer 18 via the third capacitor C3.

The detection circuit 17 detects a charging current flowing into the third capacitor C3 or a discharging current flowing from the third capacitor C3, and outputs to a mask circuit 11a a charging period detection signal gs3 or a discharging period detection signal sg3.

The mask circuit 11a may receive the charging period detection signal gs3 from an input terminal of the charging period detection signal gs1 or gs2 of the mask circuit 11 shown in FIG. 4 and receive the discharging period detection signal sg3 from an input terminal of the discharging period detection signal sg1 or sg2 (not shown).

It is noted that although the detection circuit 15a detects a charging or discharging current flowing into or from the first capacitor C1 and the detection circuit 16a detects a charging or discharging current flowing into or from the second capacitor C2, each of the detection circuits 15a and 16a does not output to the mask circuit 11a a charging period detection signal or a discharging period detection signal.

The detection circuit 21a, which detects a differential input and sets a reference value to a C3 signal, determines as in-phase noise signal transmission due to charging or discharging of the first capacitor C1 which occurs due to external factor such as voltage fluctuation of the high-side ground potential VS, and prevents unreliable signal transmission. Also, the detection circuit 22a, which detects a differential input and sets a reference value to a C3 signal, determines as in-phase noise signal transmission due to charging or discharging of the second capacitor C2 which occurs due to external factor such as voltage fluctuation of the high-side ground potential VS, and prevents unreliable signal transmission.

Thus, the level-shift circuit of the second exemplary embodiment has the same effect as the level-shift circuit of the first exemplary embodiment.

What is claimed is:

1. A level-shift circuit that converts a first voltage level into a second voltage level different from the first voltage level, comprising:
   a low-side switch;
   a high-side switch connected to the low-side switch in series;
   a first capacitor into or from which an electric current flows according to a voltage fluctuation at a connection point of the low-side switch and the high-side switch;
   a second capacitor into or from which an electric current flows according to a voltage fluctuation at the connection point;
   an electric current detection circuit that detects at least one of the electric current flowing into or from the first capacitor and the electric current flowing into or from the second capacitor;
   a set level circuit that sets a logical voltage state of the second voltage level for driving the high-side switch based on the current flowing into or from the via a first capacitor;
   a reset level circuit that resets the logical voltage state of the second voltage level for driving the high-side switch based on the current flowing into or from the second capacitor;
   a drive circuit that on-off drives the high-side switch by a set signal of the set level circuit and a reset signal of the reset level circuit; and
   a mask circuit that masks at least one of a drive signal input into the set level circuit and a drive signal input into the reset level circuit during a period of time when the electric current detection circuit carries out the detection, the electric current flows into or from the first capacitor, and the electric current flows into or from the second capacitor.

2. The level-shift circuit according to claim 1, wherein for a logical voltage state of a different voltage level driven by the set level circuit and the reset level circuit, the reset signal of the reset level circuit is accorded priority over the set signal of the set level circuit.

* * * * *